(12) United States Patent
Reznicek et al.

(10) Patent No.: US 10,944,012 B2
(45) Date of Patent: Mar. 9, 2021

(54) AREA-EFFICIENT INVERTER USING STACKED VERTICAL TRANSISTORS

(71) Applicant: International Business Machines Corporation, Armonk, NY (US)

(72) Inventors: Alexander Reznicek, Troy, NY (US); Kangguo Cheng, Schenectady, NY (US); Karthik Balakrishnan, Scarsdale, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 16/238,263

(22) Filed: Jan. 2, 2019

(65) Prior Publication Data

US 2020/0212226 A1 Jul. 2, 2020

(51) Int. Cl.
| | | |
|---|---|---|
| *H01L 29/786* | (2006.01) | |
| *H01L 27/092* | (2006.01) | |
| *H01L 21/8238* | (2006.01) | |
| *H03K 19/0948* | (2006.01) | |
| *H01L 29/417* | (2006.01) | |
| *H01L 29/423* | (2006.01) | |

(52) U.S. Cl.
CPC .............. *H01L 29/78642* (2013.01); *H01L 21/823871* (2013.01); *H01L 21/823885* (2013.01); *H01L 27/092* (2013.01); *H01L 29/41741* (2013.01); *H01L 29/42392* (2013.01); *H03K 19/0948* (2013.01)

(58) Field of Classification Search
CPC ....... H01L 29/78642; H01L 21/823871; H01L 27/092; H01L 21/823885; H01L 29/41741; H01L 29/42392; H03K 19/0948
See application file for complete search history.

(56) References Cited

U.S. PATENT DOCUMENTS

| | | | |
|---|---|---|---|
| 4,810,906 A | * | 3/1989 | Shah ................... H01L 27/092 257/334 |
| 5,010,386 A | * | 4/1991 | Groover, III .......... H01L 27/092 257/328 |
| 8,039,893 B2 | | 10/2011 | Masuoka et al. |
| 9,299,835 B1 | | 3/2016 | Anderson et al. |
| 9,680,473 B1 | | 6/2017 | Anderson et al. |
| 9,761,728 B1 | | 9/2017 | Cheng et al. |
| 9,824,933 B1 | | 11/2017 | Pawlak |
| 9,876,015 B1 | | 1/2018 | Balakrishnan et al. |
| 2006/0261406 A1 | | 11/2006 | Chen |
| 2007/0148939 A1 | * | 6/2007 | Chu ..................... H01L 29/778 438/590 |
| 2013/0164891 A1 | | 6/2013 | Bryant et al. |
| 2016/0043074 A1 | | 2/2016 | Hurley et al. |
| 2017/0025412 A1 | | 1/2017 | Jun et al. |
| 2018/0090387 A1 | * | 3/2018 | Jacob ................. H01L 27/0688 |

* cited by examiner

*Primary Examiner* — Steven H Loke
*Assistant Examiner* — Juanita B Rhodes
(74) *Attorney, Agent, or Firm* — Scully, Scott, Murphy & Presser, P C.; L. Jeffrey Kelly, Esq.

(57) ABSTRACT

An inverter that includes an n-type field effect transistor (nFET) and a p-type field effect transistor (pFET) vertically stacked one atop the other and containing a buried metal semiconductor alloy strap that connects a drain region of the nFET to a drain region of the pFET is provided. Also, provided is a cross-coupled inverter pair with nFETs and pFETs stacked vertically.

19 Claims, 6 Drawing Sheets

AREA-EFFICIENT INVERTER USING STACKED VERTICAL TRANSISTORS

BACKGROUND

The present application relates to a semiconductor structure and a method of forming the same. More particularly, the present application relates to a semiconductor structure (i.e., an inverter) that includes an n-type field effect transistor (nFET) and a p-type field effect transistor vertically stacked one atop the other and containing a buried metal semiconductor alloy strap that connects a drain region of the nFET to a drain region of the pFET. The present application also provides a cross-coupled inverter pair with nFETs and pFETs stacked vertically.

Vertical transistors have been explored as a viable device architecture for extending complementary metal oxide semiconductor (CMOS) technology beyond the 7 nm node. Conventional vertical transistors are devices where the source-drain current flows in a direction normal to a surface of a semiconductor substrate. In such devices, a vertical semiconductor material containing pillar defines the channel with the source and drain located at opposing ends of the pillar.

Monolithic three-dimensional (3D) integration is considered as an alternative approach to continue vertical transistor density scaling. One scenario is to stack an n-type field effect transistor (nFET) and a p-type field effect transistor (pFET) on top of each other creating a stacked FET structure. An inverter is an essential building block for designing CMOS circuits. Also, a cross-coupled inverter pair is an essential building block for designing many circuits, such as, for example, SRAM bitcells, comparators, and sense amplifiers.

There is thus a need to provide an inverter which is compatible with a stacked vertical transistor processing flow. There is also a need to provide a cross-coupled inverter pair with nFETs and pFETs stacked vertically.

SUMMARY

An inverter that includes an n-type field effect transistor (nFET) and a p-type field effect transistor (pFET) vertically stacked one atop the other and containing a buried metal semiconductor alloy strap that connects a drain region of the nFET to a drain region of the pFET is provided. Also, provided is a cross-coupled inverter pair with nFETs and pFETs stacked vertically.

In one aspect of the present application, a semiconductor structure (i.e., inverter) is provided. In one embodiment, the inverter includes a semiconductor material pillar extending upward from a first doped semiconductor material layer of a first conductivity type. The semiconductor material pillar includes, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type. A first gate structure of the first conductivity type contacts a sidewall of the first semiconductor channel material, and a second gate structure of the second conductivity type contacts a sidewall of the second semiconductor channel material. A metal semiconductor alloy strap connects the second doped semiconductor material that provides a drain region of the first gate structure to the third doped semiconductor material that provides a drain region of the second gate structure.

In another embodiment, a cross-coupled inverter is provided. In this embodiment, the cross-coupled inverter includes a first semiconductor material pillar extending upward from a first doped semiconductor material layer of a first conductivity type. The first semiconductor material pillar includes, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type. A first gate structure of the first conductivity type contacts a sidewall of the first semiconductor channel material of the first semiconductor material pillar, and a second gate structure of the second conductivity type contacts a sidewall of the second semiconductor channel material of the first semiconductor pillar. A first metal semiconductor alloy strap connects the second doped semiconductor material of the first semiconductor material pillar that provides a drain region of the first gate structure to the third doped semiconductor material of the first semiconductor material pillar that provides a drain region of the second gate structure.

The cross-coupled inverter further includes a second semiconductor material pillar extending upward from the first doped semiconductor material layer of the first conductivity type and spaced apart from the first semiconductor material pillar. The second semiconductor material pillar includes, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type. A third gate structure of the first conductivity type contacts a sidewall of the first semiconductor channel material of the second semiconductor material pillar, and a fourth gate structure of the second conductivity type contacts a sidewall of the second semiconductor channel material of the second semiconductor pillar. A second metal semiconductor alloy strap connects the second doped semiconductor material of the second semiconductor material pillar that provides a drain region of the third gate structure to the third doped semiconductor material of the second semiconductor material pillar that provides a drain region of the fourth gate structure.

The cross-coupled inverter further includes a first gate contact structure contacting the third and fourth gate structures, a first drain contact structure contacting the first metal semiconductor alloy strap, wherein the first gate contact structure and the first drain contact structure are tied together by a first contact structure, an upper source contact structure contacting the fourth doped semiconductor material of the first and second semiconductor material pillars, a second drain contact structure contacting the second metal semiconductor alloy strap, a second gate contact structure contacting the first and second gate structures, wherein the second drain contact structure and the second gate contact structure are tied together by another contact structure, and a bottom source contact structure contacting the first doped semiconductor layer.

In another aspect of the present application, a method of forming a semiconductor structure (i.e., inverter) is provided. In one embodiment, the method includes forming a semiconductor material pillar extending upward from a first doped semiconductor material layer of a first conductivity type. The semiconductor material pillar includes, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type. A material stack is then formed laterally adjacent to the semiconductor material pillar. The material stack includes, from bottom to top, a first spacer layer, a first sacrificial gate material layer, a second spacer layer, a first placeholder material layer, a third spacer layer, a second sacrificial gate material layer, a fourth spacer layer, and a second placeholder material layer. Next, the first and second sacrificial gate material layers are removed to physically expose the first and second semiconductor channel materials of the semiconductor material pillar. A first gate structure of the first conductivity type is formed contacting a sidewall of the first semiconductor channel material, and a second gate structure of the second conductivity type is also formed contacting a sidewall of the second semiconductor channel material. The first placeholder material layer is then removed to physically expose sidewalls of the second doped semiconductor material and the third doped semiconductor material. A metal semiconductor alloy strap is formed contacting the physically exposed sidewalls of the second doped semiconductor material and the third doped semiconductor material.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
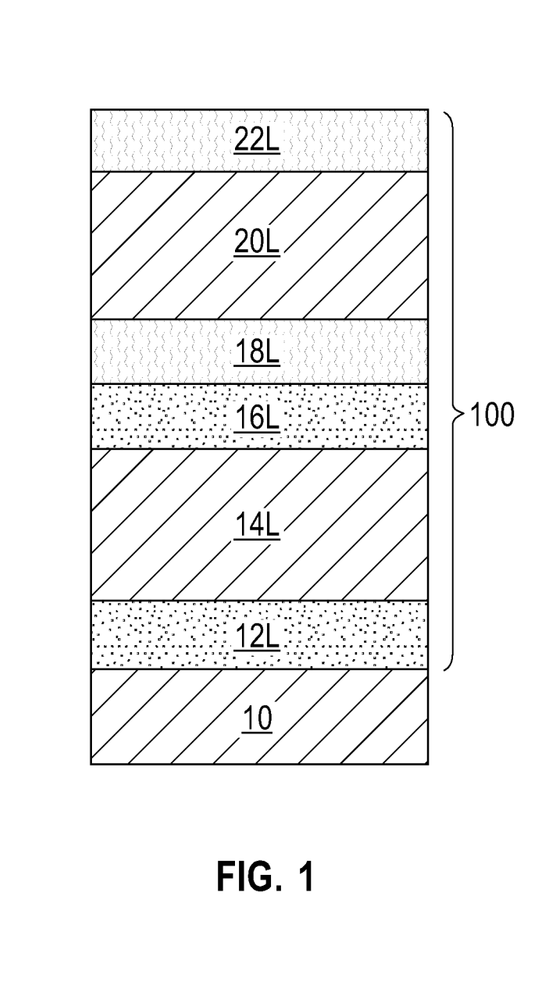
FIG. 1 is a cross sectional view of an exemplary semiconductor structure including an epitaxial semiconductor material stack located on a semiconductor substrate, wherein the epitaxial semiconductor material stack includes, from bottom to top, a first doped semiconductor material layer of a first conductivity type, a first semiconductor channel material layer, a second doped semiconductor material layer of the first conductivity type, a third doped semiconductor material layer of a second conductivity type that is opposite from the first conductivity type, a second semiconductor channel material layer, and a fourth doped semiconductor material layer of the second conductivity type.

Referring first to FIG. 1, there is illustrated an exemplary semiconductor structure that can be employed in accordance with an embodiment of the present application. The exemplary semiconductor structure of FIG. 1 includes an epitaxial semiconductor material stack 100 located on a semiconductor substrate 10. In accordance with the present application, the epitaxial semiconductor material stack 100 includes, from bottom to top, a first doped semiconductor material layer 12L of a first conductivity type, a first semiconductor channel material layer 14L, a second doped semiconductor material layer 16L of the first conductivity type, a third doped semiconductor material layer 18L of a second conductivity type that is opposite from the first conductivity type, a second semiconductor channel material layer 20L, and a fourth doped semiconductor material layer 22L of the second conductivity type.

The semiconductor substrate 10 that can be employed in the present application includes at least one semiconductor material having semiconducting properties. Examples of semiconductor materials that provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 10 can be a single crystalline semiconductor material. The semiconductor substrate 10 can have any of the well known crystal orientations. For example, the crystal orientation of the semiconductor substrate 10L may be {100}, {110}, or {111}. Other crystallographic orientations besides those specifically mentioned can also be used in the present application.

The semiconductor substrate 10 may be a bulk semiconductor substrate. By "bulk semiconductor substrate" it is meant a substrate that is entirely composed of one or more semiconductor material. In one example, the bulk semiconductor substrate is a bulk silicon substrate. In another embodiment of the present application, the semiconductor substrate 10 is a semiconductor-on-insulator that includes, from bottom to top, a handle substrate, an insulator layer, and a topmost semiconductor material layer.

The first doped semiconductor material layer 12L of the epitaxial semiconductor material stack 100 is composed of one of the semiconductor materials mentioned above for the semiconductor substrate 10, and an n-type or a p-type dopant. As known to those skilled in the art, when the dopant is n-type, the first conductivity type is n-type, and when the dopant is p-type, the first conductivity type is p-type. The term "n-type" denotes the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" denotes the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In embodiment, the first doped semiconductor material layer 12L is composed of silicon or a silicon germanium alloy that is doped with boron. The concentration of dopant that is present in the first doped semiconductor material layer 12L is typically from 5E19 atoms/cm$^3$ to 3E21 atoms/cm$^3$. The first doped semiconductor material layer 12L may have a thickness from 50 nm to 200 nm. Other thicknesses are possible and can be used as the thickness of the first doped semiconductor material layer 12L.

The first semiconductor channel material layer 14L of the epitaxial semiconductor material stack 100 is composed of one of the semiconductor materials mentioned above for the semiconductor substrate 10. The first semiconductor channel material layer 14L may be composed of a same or different semiconductor material than the first doped semiconductor material layer 12L. Typically, the first semiconductor channel material layer 14L is composed of a non-doped semiconductor material. In some embodiments, the semiconductor material that provides the first semiconductor channel material layer 12L is selected to provide high electron mobility for either an nFET or a pFET. In an embodiment, the first semiconductor channel material layer 14L is composed of undoped silicon. The first semiconductor channel material layer 14L may have a thickness from 20 nm to 100 nm. Other thicknesses are possible and can be used as the thickness of the first semiconductor channel material layer 14L.

The second doped semiconductor material layer 16L of the epitaxial semiconductor material stack 100 is composed of one of the semiconductor materials mentioned above for the semiconductor substrate 10 and a same conductivity type dopant as the first doped semiconductor material layer 12L. The second doped semiconductor material layer 16L may be composed of a same, or a different, semiconductor material than the first doped semiconductor material layer 12L. In one example, the first doped semiconductor material layer 12L and the second doped semiconductor material layer 16L are both composed of silicon or a silicon germanium alloy that is doped with boron. The concentration of dopant that is present in the second doped semiconductor material layer 16L is typically from 5E19 atoms/cm$^3$ to 3E21 atoms/cm$^3$. The second doped semiconductor material layer 16L may have a thickness from 50 nm to 100 nm. Other thicknesses are possible and can be used as the thickness of the second doped semiconductor material layer 16L.

The third doped semiconductor material layer 18L of the epitaxial semiconductor material stack 100 is composed of one of the semiconductor materials mentioned above for the semiconductor substrate 10 and a different conductivity type dopant as the first doped semiconductor material layer 12L and the second doped semiconductor material layer 16L. The third doped semiconductor material layer 18L may be composed of a same, or a different, semiconductor material than the first doped semiconductor material layer 12L and/or the second doped semiconductor material layer 16L. In one example, the first and second doped semiconductor materials (12L, 16L) are both composed of silicon or a silicon germanium alloy that is doped with boron, while the third doped semiconductor material layer 18L is composed of silicon that is doped with phosphorus. The concentration of dopant that is present in the third doped semiconductor material layer 18L is typically from 5E19 atoms/cm$^3$ to 3E21 atoms/cm$^3$. The third doped semiconductor material layer 18L may have a thickness from 50 nm to 100 nm. Other thicknesses are possible and can be used as the thickness of the third doped semiconductor material layer 18L.

The second semiconductor channel material layer 20L of the epitaxial semiconductor material stack 100 is composed of one of the semiconductor materials mentioned above for the semiconductor substrate 10. Typically, the second semiconductor channel material layer 20L is composed of a non-doped semiconductor material. In some embodiments, the semiconductor material that provides the second semiconductor channel material layer 20L is selected to provide high electron mobility for either an nFET or a pFET. In one embodiment, the second semiconductor channel material layer 20L is composed of undoped silicon. The second semiconductor channel material layer 20L may have a thickness from 20 nm to 100 nm. Other thicknesses are possible and can be used as the thickness of the second semiconductor channel material layer 20L.

The fourth doped semiconductor material layer 22L of the epitaxial semiconductor material stack 100 is composed of one of the semiconductor materials mentioned above for the semiconductor substrate 10 and a second conductivity type dopant that is different from the first conductivity type dopant. The fourth doped semiconductor material layer 20L may be composed of a same, or a different, semiconductor material than the first doped semiconductor material layer 12L and/or the second doped semiconductor material layer 16L and/or the third doped semiconductor material layer 18L. In one example, the first and second doped semiconductor materials (12L, 16L) are both composed of silicon or a silicon germanium alloy that is doped with boron, while the third and fourth doped semiconductor material layers (18L, 22L) are composed of silicon that is doped with phosphorus. The concentration of dopant that is present in the fourth doped semiconductor material layer 22L is typically from 5E19 atoms/cm$^3$ to 3E21 atoms/cm$^3$. The fourth doped semiconductor material layer 22L may have a thickness from 50 nm to 100 nm. Other thicknesses are possible and can be used as the thickness of the fourth doped semiconductor material layer 22L.

The epitaxial semiconductor material stack 100 can by formed by the sequential epitaxial growth of the first doped semiconductor material layer 12L, the first semiconductor channel material layer 14L, the second doped semiconductor material layer 16L, the third doped semiconductor material layer 18L, the second semiconductor channel material layer 20L, and the fourth doped semiconductor material layer 22L.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, each semiconductor layer of the epitaxial semiconductor material stack 100 has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. In some embodiments, the gas source for the epitaxial growth may include a silicon containing gas source and/or an admixture of a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, or combinations thereof. In some embodiments, an epitaxial SiGe alloy can be formed from a source gas that includes a compound containing silicon and germanium. Carrier gases like hydrogen, nitrogen, helium and argon can be used. For the epitaxial growth of the first doped semiconductor material layer 12L, the second doped semiconductor material layer 16L, the third doped semiconductor material layer 18L, and the fourth doped semiconductor material layer 22L an appropriate conductivity type dopant is added to the precursor gas or gas mixture. For the epitaxial growth of the first and second semiconductor channel material layers (14L, 20L) no dopant is typically present in, or added into, the precursor gas or gas mixture.

Figure 2:
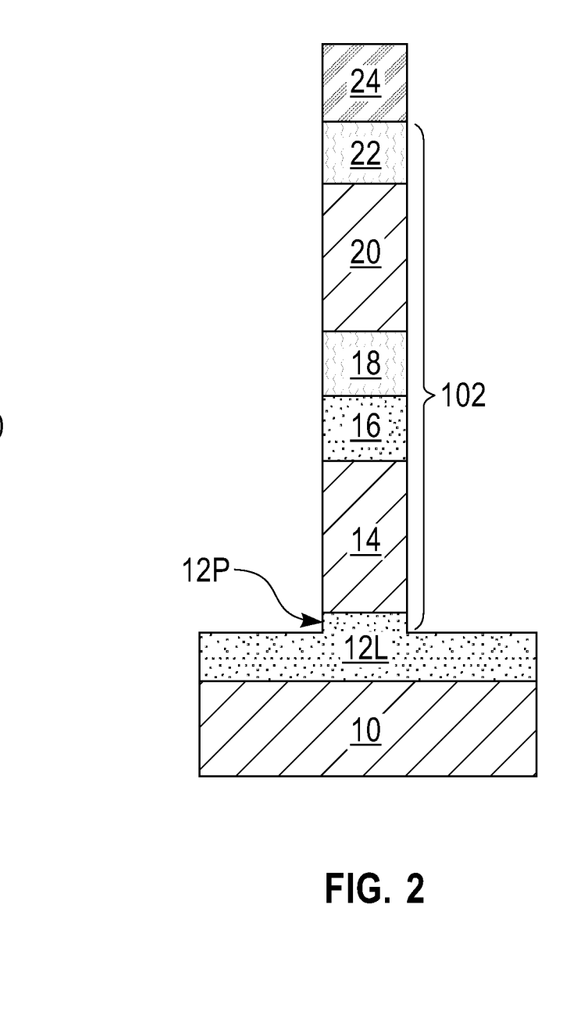
FIG. 2 is a cross sectional view of the exemplary semiconductor structure of FIG. 1 after forming a hard mask layer on a topmost surface of the epitaxial semiconductor material stack, and patterning the hard mask layer and the epitaxial semiconductor material stack to form a hard mask cap, and a semiconductor material pillar, respectively.

Referring now to FIG. 2, there is illustrated the exemplary semiconductor structure of FIG. 1 after forming a hard mask layer (not shown) on a topmost surface of the epitaxial semiconductor material stack 100, and patterning the hard mask layer and the epitaxial semiconductor material stack to form a hard mask cap 24, and a semiconductor material pillar 102, respectively.

The hard mask layer can include any hard mask dielectric material such as, for example, silicon dioxide, silicon nitride and/or silicon oxynitride. In some embodiments, the hard mask layer can be formed utilizing a conventional deposition process such as, for example, chemical vapor deposition (CVD), plasma enhanced chemical vapor deposition (PECD), physical vapor deposition (PVD) or atomic layer deposition (ALD). In other embodiments, the hard mask layer may be formed utilizing a thermal growth process such as, for example, thermal oxidation. In yet other embodiments, the hard mask layer can be formed by a combination of a deposition process and a thermal growth process. The hard mask layer may have a thickness from 10 nm to 25 nm. Other thicknesses for the hard mask layer are possible and can be used in the present application.

After forming the hard mask layer on the topmost surface of the epitaxial semiconductor material stack 100, the hard mask layer and the epitaxial semiconductor material stack 100 are patterned. The patterning stops within an upper position of the first doped semiconductor material layer 12L. Patterning may be performed by lithography and etching, a sidewall image transfer (SIT) process or by direct self-assembly (DSA) process in which a copolymer that is capable of direct self-assembly is used.

After patterning a portion of the hard mask layer and a portion of the epitaxial semiconductor material stack 100. The remaining portion, i.e., non etched portion, of the hard mask layer is referred herein as the hard mask cap 24. The remaining portion, i.e., non-etched portion, of the epitaxial semiconductor material stack 100 is referred to herein as the semiconductor material pillar 102. The semiconductor pillar 102, which extends upward from the first doped semiconductor material layer 12L, includes a first doped semiconductor material pedestal portion 12P of the first conductivity type, a first semiconductor channel material 14, a second doped semiconductor material 16 of the first conductivity type, a third doped semiconductor material 18 of a second conductivity type that is opposite from the first conductivity type, a second semiconductor channel material 20, and a fourth doped semiconductor material 22 of the second conductivity type. The first doped semiconductor material layer 12L and the first doped semiconductor material pedestal portion 12P are of unitary construction and are composed of a same semiconductor material and dopant.

The semiconductor pillar 102 is a fin structure. The term "fin structure" is used in the present application to define a structure that includes a pair of vertical sidewalls that are parallel to each other. A surface is "vertical" if there exists a vertical plane from which the surface does not deviate by more than three times the root mean square roughness of the surface. Although a single semiconductor pillar, i.e., fin structure, is described and illustrated as being formed, a plurality of semiconductor pillars can be formed. Each semiconductor pillar that is formed can have a vertical height from 20 nm to 300 nm, a width from 5 nm to 30 nm, and a length from 20 nm to 300 nm. Other vertical heights and/or widths and/or lengths that are lesser than, or greater than, the ranges mentioned herein can also be used in the present application.

The first doped semiconductor material layer 12L and the first doped semiconductor material pedestal portion 12P will provide a source region for a first conductivity type gate structure, the second doped semiconductor material 16 of the first conductivity type will provide a drain region of the first conductivity type gate structure, the third doped semiconductor material 18 of the second conductivity type will provide a drain region of a second conductivity type gate structure, and the fourth doped semiconductor material 22 of the second conductivity type will provide the source region of the second conductivity type gate structure.

Figure 3:
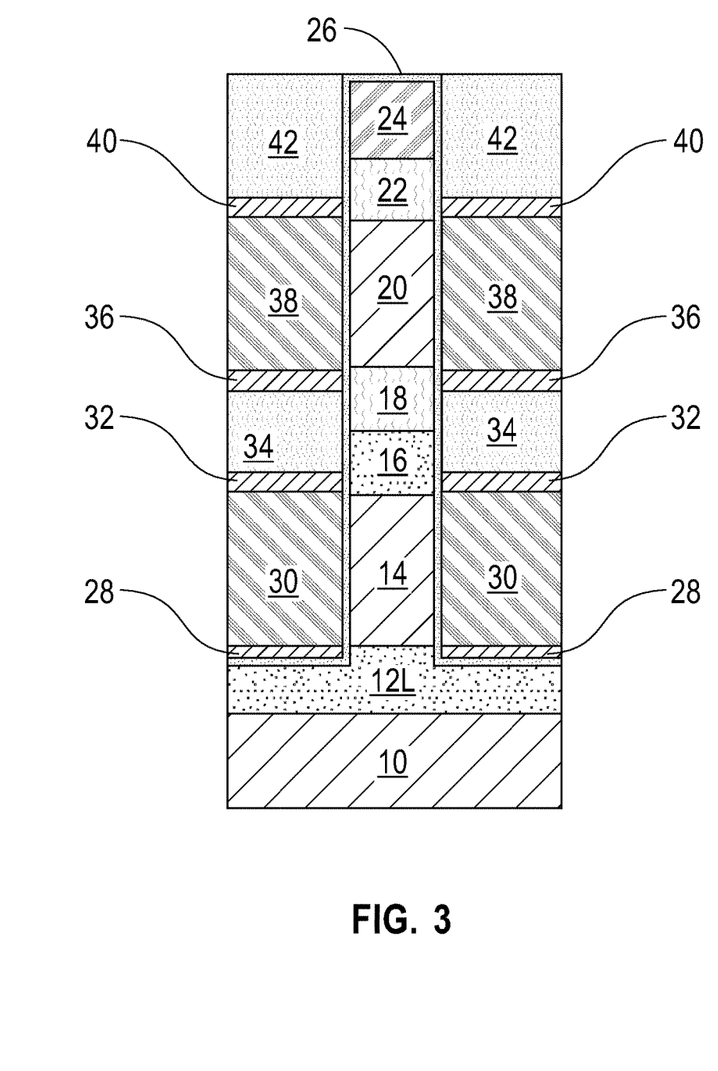
FIG. 3 is a cross sectional view of the exemplary semiconductor structure of FIG. 2 after forming a dielectric material liner on physically exposed surfaces of the hard mask cap and the semiconductor material pillar, and forming a material stack located laterally adjacent the hard mask cap and the semiconductor material pillar, wherein the material stack includes, from bottom to top, a first spacer layer, a first sacrificial gate material layer, a second spacer layer, a first placeholder material layer, a third spacer layer, a second sacrificial gate material layer, a fourth spacer layer, and a second placeholder material layer.

Referring now to FIG. 3, there is illustrated the exemplary semiconductor structure of FIG. 2 after forming a dielectric material liner 26 on physically exposed surfaces of the hard mask cap 24 and the semiconductor material pillar 102, and forming a material stack located laterally adjacent the hard mask cap 24 and the semiconductor material pillar 102. In accordance with the present application, the material stack includes, from bottom to top, a first spacer layer 28, a first sacrificial gate material layer 30, a second spacer layer 32, a first placeholder material layer 34, a third spacer layer 36, a second sacrificial gate material layer 38, a fourth spacer layer 40, and a second placeholder material layer 42.

The dielectric material liner 26 is composed of a dielectric material that is compositionally different from the hard dielectric material that provides the hard mask cap 24. In one embodiment, and when the hard mask cap 24 is composed of silicon nitride, than the dielectric material liner 26 is composed of silicon dioxide. The dielectric material liner 26 can be formed utilizing a conformal deposition process or a low temperature (500° C. or less) thermal growth process. The dielectric material liner 26 can have a thickness from 1 nm to 10 nm. Other thicknesses are possible and can be used as the thickness of the dielectric material liner 26. In addition to being formed on the physically exposed surfaces of the hard mask cap 24 and the semiconductor material pillar 102, the dielectric material liner is also present on the remaining portion of the first doped semiconductor material layer 12L. In some embodiments, the dielectric material liner formation can be omitted.

Each of the first spacer layer 28, the first sacrificial gate material layer 30, the second spacer layer 32, the first placeholder material layer 34, the third spacer layer 36, the second sacrificial gate material layer 38, the fourth spacer layer 40, and the second placeholder material layer 42 can be formed utilizing a directional deposition process such as, for example, CVD or PECVD. A planarization process such as, for example, chemical mechanical polishing (CMP), may follow the formation of the second placeholder material layer 42.

The first spacer layer 28, the second spacer layer 32, the third spacer layer 36 and the fourth spacer layer 40 are composed of a spacer dielectric material that is compositionally different from the dielectric material liner 26. The first spacer layer 28, the second spacer layer 32, the third spacer layer 36 and the fourth spacer layer 40 may be composed of a same, or a different, spacer dielectric material. In one embodiment, the spacer dielectric material that provides the first spacer layer 28, the second spacer layer 32, the third spacer layer 36 and the fourth spacer layer 40 is composed of silicon nitride. The first spacer layer 28, the second spacer layer 32, the third spacer layer 36 and the fourth spacer layer 40 may have a thickness from 10 nm to 50 nm. Other thicknesses are also contemplated for the thickness of the first spacer layer 28, the second spacer layer 32, the third spacer layer 36 and the fourth spacer layer 40.

The first spacer layer 28 is located laterally adjacent the first doped semiconductor material pedestal portion 12P, the second spacer layer 32 is located laterally adjacent to a lower portion of the second doped semiconductor material 16, the third spacer layer 26 is located laterally adjacent to an upper portion of the third doped semiconductor material layer 18, and the fourth spacer layer 32 is located laterally adjacent to a lower portion of the fourth doped semiconductor material 22.

The first sacrificial gate material layer 30 and the second sacrificial gate material layer 38 can be composed of polysilicon, amorphous silicon, an elemental metal (e.g., tungsten, titanium, tantalum, aluminum, nickel, ruthenium, palladium and platinum), an alloy of at least two elemental metals or multilayered combinations thereof. The first sacrificial gate material layer 30 may be compositionally the same as, or compositionally different from, the second sacrificial gate material layer 38. The first sacrificial gate material layer 30 and the second sacrificial gate material layer 38 can have a thickness from 50 nm to 200 nm. Although other thicknesses are possible and can be used as the thickness of the first sacrificial gate material layer 30 and the second sacrificial gate material layer 38.

The first sacrificial gate material layer 30 is located laterally adjacent to the first semiconductor channel material 14 and is located between the first spacer layer 28 and the second spacer layer 32. The second sacrificial gate material layer 38 is located laterally adjacent to the second semiconductor channel material 20 and is located between the third spacer layer 36 and the fourth spacer layer 40.

The first placeholder material layer 34 and the second placeholder material layer 42 are composed of a material that is compositionally different from the first and second sacrificial gate material layers (30, 38) as well as the first spacer layer 28, the second spacer layer 32, the third spacer layer 36 and the fourth spacer layer 40. In one embodiment, the first placeholder material layer 34 and the second placeholder material layer 42 are composed silicon dioxide, the first and second sacrificial gate material layers (30, 38) are composed of polysilicon, and each of the first spacer layer 28, the second spacer layer 32, the third spacer layer 36 and the fourth spacer layer 40 is composed of silicon nitride. The first placeholder material layer 34 and the second placeholder material layer 42 can have a thickness from 25 nm to 150 nm. Although other thicknesses are possible and can be used as the thickness of first placeholder material layer 34 and the second placeholder material layer 42.

The first placeholder material layer 34 is located laterally adjacent to an upper portion of the second doped semiconductor material 16 and a lower portion of the third doped semiconductor material 18 and is located between the second gate spacer layer 32 and the third gate spacer layer 36. The second placeholder material layer 34 is located laterally adjacent to an upper portion of the fourth doped semiconductor material layer 22 and the hard mask cap 24 and is located on a topmost surface of the fourth spacer layer 40. The second placeholder material layer 42 has a topmost surface that is typically coplanar with a topmost surface of the dielectric material liner 26 that is present on the topmost surface of the semiconductor material pillar 102.

Figure 4:
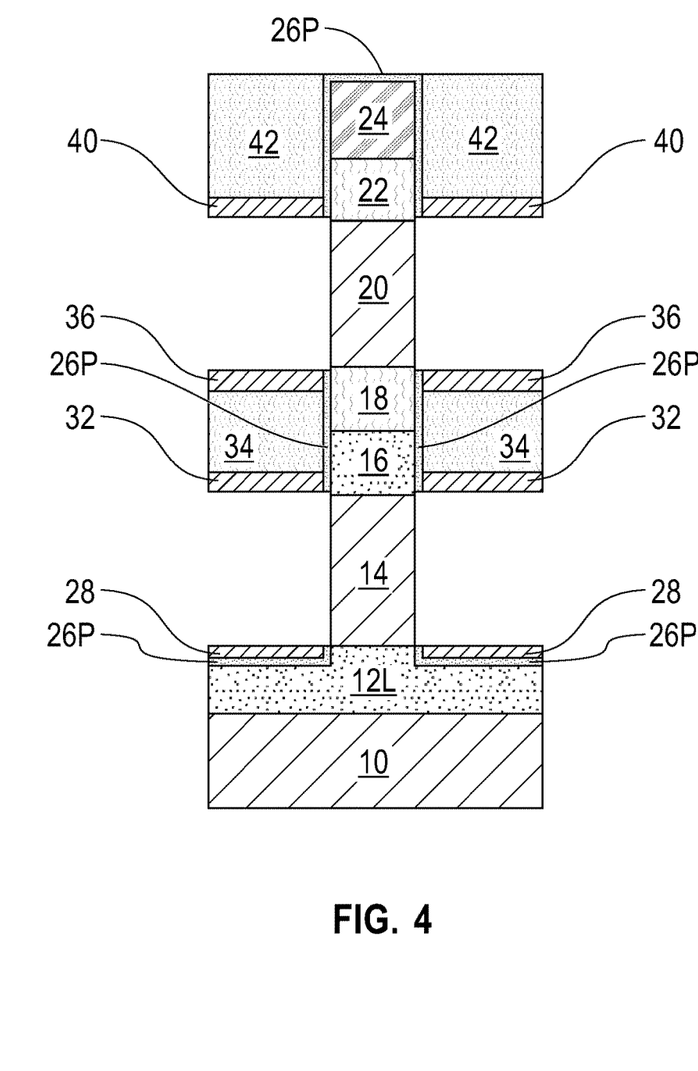
FIG. 4 is a cross sectional view of the exemplary semiconductor structure of FIG. 3 after removing the first and second sacrificial gate material layer and underlying portions of the dielectric material liner to physically expose first and second semiconductor channel materials of the semiconductor material pillar.

Referring now to FIG. 4, there is illustrated the exemplary semiconductor structure of FIG. 3 after removing the first and second sacrificial gate material layers (30, 38) and underlying portions of the dielectric material liner 26 to physically expose first and second semiconductor channel materials (14, 20) of the semiconductor material pillar 102.

The first and second sacrificial gate material layers (30, 38) can be removed utilizing an etching process that is selective in removing the first and second sacrificial gate material layers (30, 38) relative to the other materials of the material stack and the dielectric material liner 26. The physically exposed portions of the dielectric material liner 26 may be removed utilizing an etching process that is selective in removing the dielectric material that provides the dielectric material liner 26. The remaining dielectric material liner 26 may be referred to herein as a dielectric material portion 26P.

Figure 5:
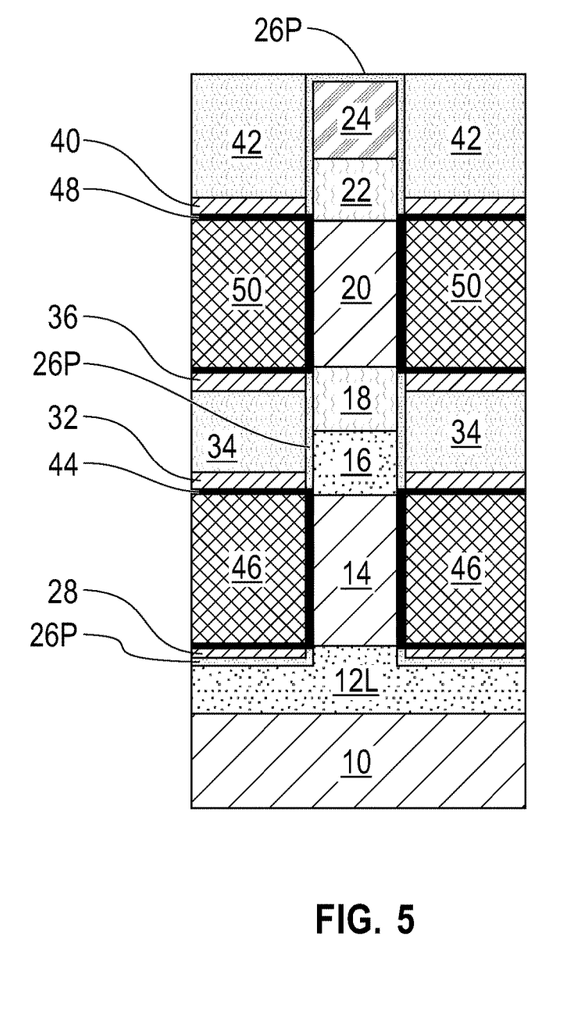
FIG. 5 is a cross sectional view of the exemplary semiconductor structure of FIG. 4 after forming a first gate structure contacting a sidewall of the first semiconductor channel material, and a second gate structure contacting a sidewall of the second semiconductor channel material.

Referring now to FIG. 5, there is illustrated the exemplary semiconductor structure of FIG. 4 after forming a first gate structure (44, 46) of the first conductivity type contacting a sidewall of the first semiconductor channel material 14, and a second gate structure (48, 50) of the second conductivity type contacting a sidewall of the second semiconductor channel material 20. The first gate structure (44, 46) includes a first gate dielectric material layer 44 and a first gate conductor layer 46. The second gate structure (48, 50) includes a second gate dielectric material layer 48 and a second gate conductor layer 50.

The first gate dielectric material layer 44 and the second gate dielectric material layer 48 are composed a gate dielectric material such as, for example, an oxide, nitride, and/or oxynitride. In one example, the gate dielectric material that provides the first and second gate dielectric material layers (44, 48) can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the first gate dielectric material layer 44 and the second gate dielectric material layer 48. Typically, but not necessarily always, the first gate dielectric material layer 44 is composed of a same gate dielectric material as the second gate dielectric material layer 48. In one embodiment, the first gate dielectric material layer 44 and the second gate dielectric material layer 48 can have a thickness in a range from 1 nm to 10 nm. Other thicknesses that are lesser than, or greater than, the aforementioned thickness range can also be employed for the first gate dielectric material layer 44 and the second gate dielectric material layer 48.

The first and second gate conductor layers (46, 50) may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, or any suitable combination of these materials. The conductive material may further comprise dopants that are incorporated during deposition. Typically, but not necessarily always, the first gate conductor layer 46 is composed of a same conductive material as the second gate conductor layer 50.

In some embodiments, a work function setting layer may be formed between the first gate dielectric material layer 44 and the first gate conductor layer 46 and/or between the second gate dielectric material layer 48 and the second gate conductor layer 50. When present, the work function setting layer is composed of any suitable work function metal (WFM) containing material. Illustrative examples of WFM containing materials that can be employed include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC), titanium aluminum carbide (TiAlC), tantalum carbide (TaC), hafnium carbide (HfC), and combinations thereof. In one embodiment, a first work function setting layer is provided to the first gate structure that provides a first threshold voltage to the first gate structure, and a second work function setting layer is provided to the second gate structure that provides a second threshold voltage to the second gate structure that is different from the first threshold voltage. In one embodiment, the work function setting layer can have a thickness in a range from 20 nm to 50 nm. Other thicknesses that are lesser than, or greater than, the aforementioned thickness range can also be employed for the work function setting layer.

Figure 6:
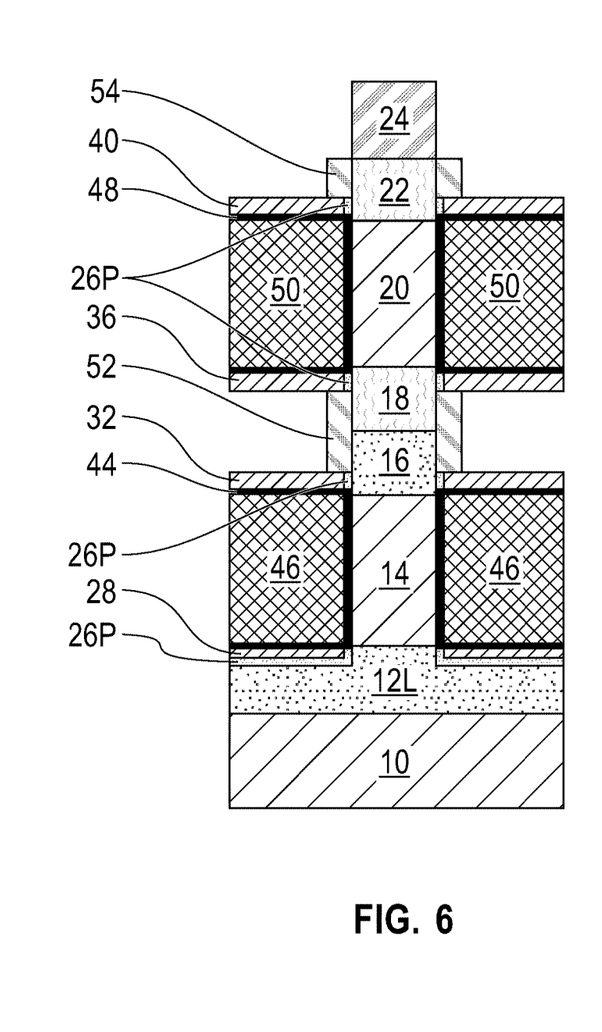
FIG. 6 is a cross sectional view of the exemplary semiconductor structure of FIG. 5 after removing the first and second placeholder material layers, and forming a first metal semiconductor alloy in the area previously occupied by the first placeholder material layer, and a second metal semiconductor alloy in the area previously occupied by the second placeholder material layer.

Referring now to FIG. 6, there is illustrated the exemplary semiconductor structure of FIG. 5 after removing the first and second placeholder material layers (34, 42), and forming a first metal semiconductor alloy 52 in the area previously occupied by the first placeholder material layer 34, and a second metal semiconductor alloy 54 in the area previously occupied by the second placeholder material layer 42.

The first and second placeholder material layers (34, 42) can be removed utilizing an etching process that is selective in removing the dielectric material that provides the first and second placeholder material layers (34, 42). The underlying dielectric material portion 26P may be removed utilizing the same as used in removing the first and second placeholder material layers (34, 42), or it may be removed utilizing a different etch than the etch used to remove the first and second placeholder material layers (34, 42).

First and second metal semiconductor alloys (52 and 54) are formed utilizing any conventional metal semiconductor alloy formation process. The metal semiconductor alloy formation process may include forming a semiconductor material on the physically exposed sidewall of the second and third doped semiconductor materials (16, 18) and the physically exposed sidewall of the fourth doped semiconductor material 22, forming a semiconductor alloy forming metal on the semiconductor material, if formed, or directly on the physically exposed sidewall of the second and third doped semiconductor materials (16, 18) and the physically exposed sidewall of the fourth doped semiconductor material 22, and performing an anneal. Examples of semiconductor alloy forming metals include Ni, Co, Pt, W, or Pd. In one embodiment, the first and second metal semiconductor alloys (52 and 54) may be composed of a nickel silicide. The anneal may be performed at a temperature of 550° C. or greater.

The first metal semiconductor alloy 52 connects the second doped semiconductor material 16 that provides a drain region of the first conductivity type device to the third doped semiconductor material 18 that provides a drain region of the second conductivity type device. The first metal semiconductor alloy 52 thus may be referred to as a metal semiconductor alloy strap. The second metal semiconductor alloy 54 contacts the sidewalls of the fourth doped semiconductor material 22 that provides the source region of the second conductivity type device.

Notably, FIG. 6 illustrates an inverter in accordance with an embodiment of the present application. In the illustrated embodiment, the inverter includes a semiconductor material pillar 102 extending upward from a first doped semiconductor material layer 12L of a first conductivity type. The semiconductor material pillar 102 includes, from bottom to top, a first doped semiconductor material pedestal portion 12P of the first conductivity type, a first semiconductor channel material 14, a second doped semiconductor material 16 of the first conductivity type, a third doped semiconductor material 18 of a second conductivity type that is opposite from the first conductivity type, a second semiconductor channel material 20, and a fourth doped semiconductor material 22 of the second conductivity type. A first gate structure (44, 48) of the first conductivity type contacts a sidewall of the first semiconductor channel material 14, and a second gate structure (48, 50) of the second conductivity type contacts a sidewall of the second semiconductor channel material 20. A metal semiconductor alloy strap 52 connects the second doped semiconductor material 16 that provides a drain region of the first gate structure (44, 46) to the third doped semiconductor material 18 that provides a drain region of the second gate structure (48, 50).

Figure 7:
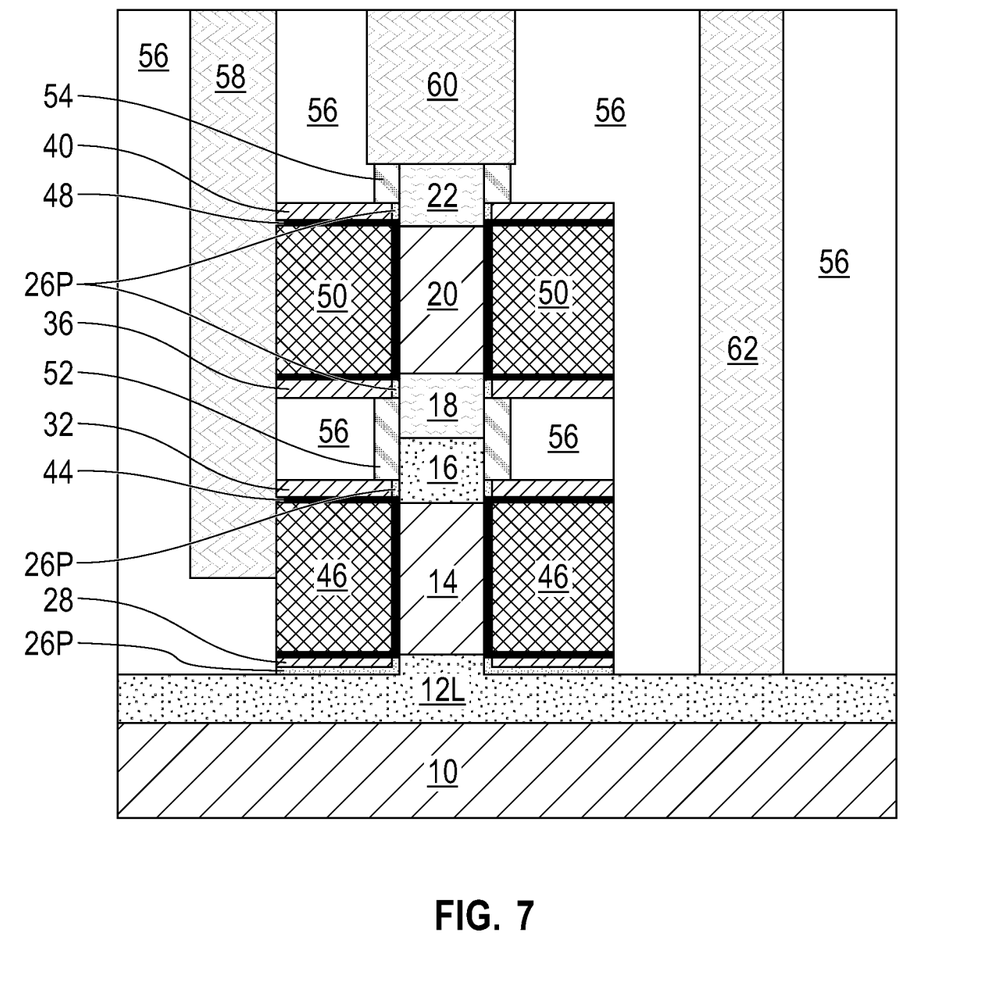
FIG. 7 is a cross sectional view of the exemplary semiconductor structure of FIG. 6 after forming an interlayer dielectric (ILD) material containing a first contact structure, a second contact structure, and a third contact structure.

Referring now to FIG. 7, there is illustrated the exemplary semiconductor structure of FIG. 6 after forming an interlayer dielectric (ILD) material 56 containing a first contact structure 58, a second contact structure 60, and a third contact structure 62. A fourth contact structure (not shown since it runs out of the page) is present that contacts the first semiconductor metal alloy 52 that is located laterally adjacent to the second doped semiconductor material 16 and the third doped semiconductor material 18.

The ILD material 56 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as ILD material 56. The ILD material 56 laterally surrounds each of the first and second gate structures and the semiconductor material pillar 102. The ILD material 56 has height that is greater than the height of the semiconductor material pillar 102.

The various contact structures (58, 60, 62, and the fourth which is not illustrated) can be formed by first providing contact openings (not shown) into the ILD layer 56. The contact openings can be formed by lithography and etching. A first contact opening physically exposes a sidewall of the first and second gate conductor layers (46, 50). A second contact opening physically exposes a topmost surface of the fourth doped semiconductor material 22 (i.e., the source region of the second conductivity type device), and the third contact opening physically exposes a surface of the first doped semiconductor material layer 12L. A fourth contact opening physically exposes a surface of the first semiconductor metal alloy that is located laterally adjacent to the second doped semiconductor material 16 and the third doped semiconductor material 18.

Each contact opening is then filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The various contact structures (58, 60, 62, and the fourth contact structure not shown) are embedded in the ILD layer 58.

As is shown, the first contact structure 58 contacts the physically exposed a sidewall of the first and second gate conductor layers (46, 50), the second contact structure 60 contacts the topmost surface of the fourth doped semiconductor material 22 (i.e., the source region of the second conductivity type device), and the third contact structure 62 contacts the exposed surface of the first doped semiconductor material layer 12L. A fourth contact structure (not shown) is present that contacts the first semiconductor metal alloy 52 that is located laterally adjacent to the second doped semiconductor material 16 and the third doped semiconductor material 18.

Figure 8:
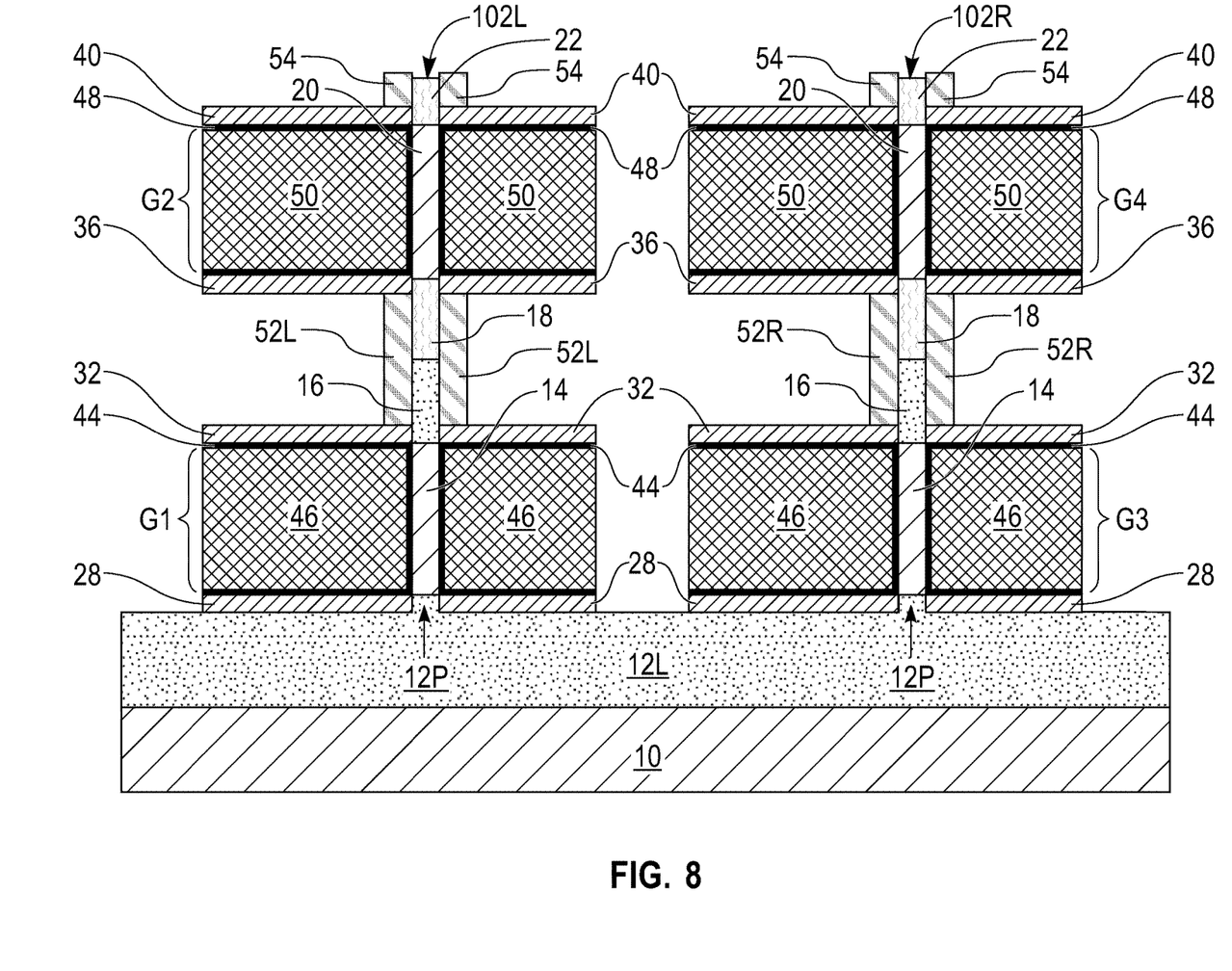
FIG. 8 is a cross sectional view of another exemplary structure accordance with an embodiment of the present application.

Referring now to FIG. 8, there is illustrated another exemplary structure (i.e., an inverter) of the present application that can be used for cross-coupling. The inverter of FIG. 8 can be made using the basic processing steps described above. Notably, the inverter includes a first semiconductor material pillar 102L extending upward from a first doped semiconductor material layer 12L of a first conductivity type. The first semiconductor material pillar 102L includes, from bottom to top, a first doped semiconductor material pedestal portion 12P of the first conductivity type, a first semiconductor channel material 14, a second doped semiconductor material 16 of the first conductivity type, a third doped semiconductor material 18 of a second conductivity type that is opposite from the first conductivity type, a second semiconductor channel material 20, and a fourth doped semiconductor material of the second conductivity type 22. A first gate structure, G1, of the first conductivity type contacts a sidewall of the first semiconductor channel material 14 of the first semiconductor material pillar 102L, and a second gate structure, G2, of the second conductivity type contacts a sidewall of the second semiconductor channel material 20 of the first semiconductor pillar 102L. A first metal semiconductor alloy strap 52L connects the second doped semiconductor material 16 of the first semiconductor material pillar 102L that provides a drain region of the first gate structure, G1, to the third doped semiconductor material 18 of the first semiconductor material pillar 102L that provides a drain region of the second gate structure, G2.

The inverter of FIG. 8 further includes a second semiconductor material pillar 102R extending upward from the first doped semiconductor material layer 12L and spaced apart from the first semiconductor material pillar 102L. The second semiconductor material pillar 102R includes, from bottom to top, a first doped semiconductor material pedestal portion 12P of the first conductivity type, a first semiconductor channel material 14, a second doped semiconductor material 16 of the first conductivity type, a third doped semiconductor material 18 of a second conductivity type that is opposite from the first conductivity type, a second semiconductor channel material 20, and a fourth doped semiconductor material 22 of the second conductivity type. A third gate structure, G3, of the first conductivity type contacts a sidewall of the first semiconductor channel material 14 of the second semiconductor material pillar 102R, and a fourth gate structure, G4, of the second conductivity type contacts a sidewall of the second semiconductor channel material 20 of the second semiconductor pillar 102R. A second metal semiconductor alloy strap 52R connects the second doped semiconductor material 16 of the second semiconductor material pillar 102R that provides a drain region of the third gate structure, G3, to the third doped semiconductor material 18 of the second semiconductor material pillar 102R that provides a drain region of the fourth gate structure, G4.

Contact structure can now be formed as described above. Notably, a first gate contact structure (see element 70 of FIG. 9) is formed that contacts the third and fourth gate structures (G3, G4), a first drain contact structure (see element 72 of FIG. 9) is formed that contacts the first metal semiconductor alloy strap 52L, wherein the first gate contact structure and the first drain contact structure are tied together by a first contact structure (see element 68 of FIG. 9), an upper source contact structure (see element 74 of FIG. 9) is formed that contacts the fourth doped semiconductor material 22 of the first and second semiconductor material pillars (102L, 102R), a second drain contact structure (see element 76 of FIG. 9) is formed that contacts the second metal semiconductor alloy strap 52R, a second gate contact structure (see element 78 of FIG. 9) is formed that contacts the first and second gate structures (G1, G2), wherein the second drain contact structure and the second gate contact structure are tied together by another contact structure (see element 75 of FIG. 9), and a bottom source contact structure (see element 80 of FIG. 9) is formed that contacts the first doped semiconductor layer 12L.

Figure 9:
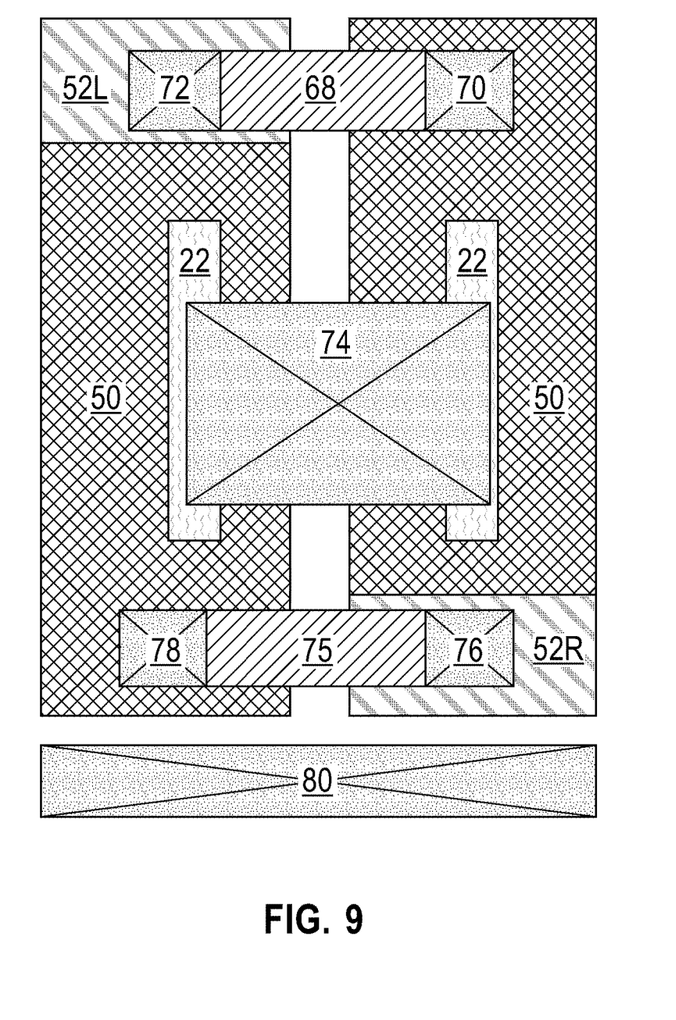
FIG. 9 is a top down view illustrating the contact structures for a cross-coupled inverter pair with nFETs and pFETs stacked vertically.
Figure 10:
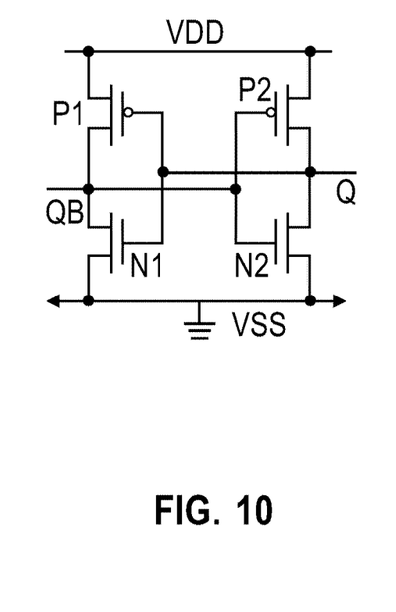
FIG. 10 is a schematic circuit diagram of the cross-coupled inverter pair shown in FIG. 9.

Referring now to FIG. 9, there is shown a top down view illustrating the contact structures for a cross-coupled inverter pair with nFETs and pFETs stacked vertically. FIG. 10 shows a schematic circuit diagram for the structure shown in FIG. 9.

In the illustrated embodiment, a first pFET (P1) is stacked above a first nFET (N1) and a second pFET (P2) is stacked above a second nFET (N2). The first pFET (P1) and first nFET (N1) are laterally adjacent to a first semiconductor material pillar 102L, and the second pFET (P2) and the second nFET (N2) are laterally adjacent a second semiconductor material pillar 102R. The first and second semiconductor pillars (102L, 102R) include elements 12P, 14, 16, 18, 20 and 22 as defined above wherein the elements 12P and 16 have an n-type conductivity, and elements 18 and 22 have a p-type conductivity. Elements 50, 22 and 52 are as defined above. The structure shown in FIG. 9 can be formed utilizing the basic processes steps mentioned above and can be derived from FIG. 8 of the present application.

In the drawing, element 70 denotes a first gate contact structure that contacts the second pFET (P2) and the second nFET (N2)-QB, and element denotes a first drain contact structure that contacts the first metal semiconductor alloy strap 52L that laterally surrounds the drain regions (i.e., the second and third doped semiconductor materials of the first semiconductor pillar 102L) of the first pFET (P1) and first nFET (N1)-QB. Contact structures 70 and 72 are tied to each other by contact structure 68. Element 74 denotes an upper source contact structure that contacts the top source regions (i.e., the fourth doped semiconductor material 22 of the first and second semiconductor material pillars (102L, 102R))-VDD. Element 76 denotes a second drain contact structure that contacts the second metal semiconductor alloy strap 52L that laterally surrounds the drain regions (i.e., the second and third doped semiconductor materials of the second semiconductor material pillar 102R) of the second pFET (P2) and second nFET (N2)-Q. Element 78 denotes a second gate contact structure that contacts the first pFET (P1) and first nFET (N1)-Q. Elements 76 and 78 are tied together by contact structure 75. Element 80 denotes a bottom source contact structure that contact the first doped semiconductor layer 12L-VSS.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An inverter comprising:
    a semiconductor material pillar extending upward from a first doped semiconductor material layer of a first conductivity type, wherein the semiconductor material pillar comprises, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type;
    a first gate structure of the first conductivity type contacting a sidewall of the first semiconductor channel material;
    a second gate structure of the second conductivity type contacting a sidewall of the second semiconductor channel material;
    a metal semiconductor alloy strap connecting the second doped semiconductor material that provides a drain region of the first gate structure to the third doped semiconductor material that provides a drain region of the second gate structure;
    a first contact structure contacting the first and second gate structures;
    a second contact structure contacting the fourth doped semiconductor material;
    a third contact structure contacting the first doped semiconductor material layer; and
    a fourth contact structure spaced from the first contact structure and contacting the metal semiconductor alloy strap.

2. The inverter of claim 1, wherein the first conductivity type is n-type, and the second conductivity type is p-type.

3. The inverter of claim 1, wherein the first conductivity type is p-type, and the second conductivity type is n-type.

4. The inverter of claim 1, wherein the first doped semiconductor material layer and the first doped semiconductor material pedestal portion are of unitary construction and provide a source region of the first gate structure.

5. The inverter of claim 4, wherein the fourth doped semiconductor material provides a source region of the second gate structure, and further comprising a metal semiconductor alloy located laterally adjacent to the fourth doped semiconductor material layer.

6. The inverter of claim 1, further comprising an interlayer dielectric (ILD) material laterally surrounding and atop the first and second gate structures and the semiconductor material pillar, wherein the first contact structure, the second contact structure, the third contact structure, and the fourth contact structure are located in the ILD material.

7. The inverter of claim 1, further comprising a first gate spacer layer located beneath the first gate structure and located laterally adjacent to the first doped semiconductor material pedestal portion, and a second gate spacer layer located above the first gate structure and laterally adjacent to a lower portion of the second doped semiconductor material.

8. The inverter of claim 7, further comprising a third gate spacer layer located beneath the second gate structure and located laterally adjacent to an upper portion of the third doped semiconductor material, and a fourth gate spacer layer located above the second gate structure and laterally adjacent to a lower portion of the fourth doped semiconductor material.

9. A cross-coupled inverter comprises:
 a first semiconductor material pillar extending upward from a first doped semiconductor material layer of a first conductivity type, wherein the first semiconductor material pillar comprises, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type;
 a first gate structure of the first conductivity type contacting a sidewall of the first semiconductor channel material of the first semiconductor material pillar;
 a second gate structure of the second conductivity type contacting a sidewall of the second semiconductor channel material of the first semiconductor pillar, wherein a first metal semiconductor alloy strap connects the second doped semiconductor material of the first semiconductor material pillar that provides a drain region of the first gate structure to the third doped semiconductor material of the first semiconductor material pillar that provides a drain region of the second gate structure;
 a second semiconductor material pillar extending upward from the first doped semiconductor material layer of the first conductivity type and spaced apart from the first semiconductor material pillar, wherein the second semiconductor material pillar comprises, from bottom to top, a fifth doped semiconductor material pedestal portion of the first conductivity type, a third semiconductor channel material, a sixth doped semiconductor material of the first conductivity type, a seventh doped semiconductor material of the second conductivity type that is opposite from the first conductivity type, a fourth semiconductor channel material, and an eighth doped semiconductor material of the second conductivity type;
 a third gate structure of the first conductivity type contacting a sidewall of the third semiconductor channel material of the second semiconductor material pillar;
 a fourth gate structure of the second conductivity type contacting a sidewall of the fourth semiconductor channel material of the second semiconductor pillar, wherein a second metal semiconductor alloy strap connects the sixth doped semiconductor material of the second semiconductor material pillar that provides a drain region of the third gate structure to the seventh doped semiconductor material of the second semiconductor material pillar that provides a drain region of the fourth gate structure;
 a first gate contact structure contacting the third and fourth gate structures;
 a first drain contact structure contacting the first metal semiconductor alloy strap, wherein the first gate contact structure and the first drain contact structure are tied together by a first contact structure;
 an upper source contact structure contacting the fourth and eighth doped semiconductor material of the first and second semiconductor material pillars respectively;
 a second drain contact structure contacting the second metal semiconductor alloy strap,
 a second gate contact structure contacting the first and second gate structures, wherein the second drain contact structure and the second gate contact structure are tied together by another contact structure, and
 a bottom source contact structure contacting the first doped semiconductor material layer.

10. The cross-coupled inverter of claim 9, wherein the first conductivity type is n-type, and the second conductivity type is p-type.

11. The cross-coupled inverter of claim 9, wherein the first conductivity type is p-type, and the second conductivity type is n-type.

12. The cross-coupled inverter of claim 9, wherein the first doped semiconductor material layer and the first doped and fifth doped semiconductor material pedestal portions of the first and second semiconductor pillars are of unitary construction and provide a source region of the first gate structure and the third gate structure.

13. The cross-coupled inverter of claim 12, wherein the fourth doped semiconductor material of the first semiconductor material pillar provides a source region of the second gate structure and further comprising a third metal semiconductor alloy strap laterally adjacent to the fourth doped semiconductor material layer of the first semiconductor material pillar, and wherein the eighth doped semiconductor material of the second semiconductor material pillar provides a source region of the fourth gate structure, and further comprising a fourth metal semiconductor alloy strap laterally adjacent to the fourth doped semiconductor material layer of the second semiconductor material pillar.

14. A method of forming a semiconductor structure, the method comprising:
 forming a semiconductor material pillar extending upward from a first doped semiconductor material layer of a first conductivity type, wherein the semiconductor material pillar comprises, from bottom to top, a first doped semiconductor material pedestal portion of the first conductivity type, a first semiconductor channel material, a second doped semiconductor material of the first conductivity type, a third doped semiconductor material of a second conductivity type that is opposite from the first conductivity type, a second semiconductor channel material, and a fourth doped semiconductor material of the second conductivity type;
 forming a material stack laterally adjacent to the semiconductor material pillar, wherein the material stack includes, from bottom to top, a first spacer layer, a first sacrificial gate material layer, a second spacer layer, a first placeholder material layer, a third spacer layer, a second sacrificial gate material layer, a fourth spacer layer, and a second placeholder material layer;

removing the first and second sacrificial gate material layers to physically expose the first and second semiconductor channel materials of the semiconductor material pillar;

forming a first gate structure of the first conductivity type contacting a sidewall of the first semiconductor channel material, and a second gate structure of the second conductivity type contacting a sidewall of the second semiconductor channel material;

removing the first placeholder material layer to physically expose sidewalls of the second doped semiconductor material and the third doped semiconductor material; and forming a metal semiconductor alloy strap contacting the physically exposed sidewalls of the second doped semiconductor material and the third doped semiconductor material.

15. The method of claim 14, wherein the first conductivity type is n-type, and the second conductivity type is p-type.

16. The method of claim 14, wherein the first conductivity type is p-type, and the second conductivity type is n-type.

17. The method of claim 14, wherein during the forming of the metal semiconductor alloy strap, a metal semiconductor alloy is formed that contacts a sidewall of the fourth doped semiconductor material.

18. The method of claim 14, further comprising forming an interlayer dielectric (ILD) material laterally surrounding and atop the first and second gate structures and the semiconductor material pillar.

19. The method of claim 18, further comprising forming a first contact structure in the ILD material and contacting the first and second gate structures, a second contact structure in the ILD material and contacting the fourth doped semiconductor material, a third contact structure in the ILD material and contacting the first doped semiconductor material layer, and a fourth contact structure in the ILD material and contacting the metal semiconductor alloy strap.

* * * * *